United States Patent
Kim et al.

(10) Patent No.: US 11,539,056 B2
(45) Date of Patent: Dec. 27, 2022

(54) FUEL CELL COMPONENTS PROTECTED WITH NITRIDE MATERIALS

(71) Applicant: Robert Bosch GmbH, Stuttgart (DE)

(72) Inventors: Soo Kim, Cambridge, MA (US); Lei Cheng, San Jose, CA (US)

(73) Assignee: Robert Bosch GmbH, Stuttgart (DE)

( * ) Notice: Subject to any disclaimer, the term of this patent is extended or adjusted under 35 U.S.C. 154(b) by 26 days.

(21) Appl. No.: 16/909,029

(22) Filed: Jun. 23, 2020

(65) Prior Publication Data

US 2021/0399313 A1 Dec. 23, 2021

(51) Int. Cl.
*H01M 8/0228* (2016.01)
*C23C 16/34* (2006.01)
(Continued)

(52) U.S. Cl.
CPC .......... *H01M 8/0228* (2013.01); *B01J 27/24* (2013.01); *C23C 16/34* (2013.01); *H01M 4/8663* (2013.01);
(Continued)

(58) Field of Classification Search
CPC ............ H01M 8/0228; H01M 4/8663; H01M 4/9041; H01M 4/9075; H01M 4/925;
(Continued)

(56) References Cited

U.S. PATENT DOCUMENTS 7,550,222 B2 6/2009 Vyas et al.
2007/0099012 A1* 5/2007 Brady ................. H01M 8/0228
428/457
(Continued)

OTHER PUBLICATIONS

Sun et al., "A map of the inorganic ternary metal nitrides", Nature Materials, vol. 18, Jul. 2019, California, 10 pages.

*Primary Examiner* — Sarah A. Slifka
*Assistant Examiner* — Rachel L Zhang
(74) *Attorney, Agent, or Firm* — Brooks Kushman P.C.

(57) ABSTRACT

A fuel cell component including a fuel cell substrate and a nitride material. The material may be a nitride compound having a chemical formula $A_xB_yN_z$, where A is a metal, B is a metal different than A, N is nitrogen, x>0, y<7 and 0<z<12. The nitride compound may have a ratio of a stoichiometric factor to a reactivity factor of greater than 1.0. The stoichiometric factor indicates the reactivity of a nitride compound with chemical species as compared to a baseline nitride compound. The reactivity factor indicates the reaction enthalpy of the nitride compound and the chemical species as compared to a baseline nitride compound and the chemical species. The nitride compound may be $Fe_3Mo_3N$, $Ni_2Mo_3N$, $Ni_2W_3N$, $CuNi_3N$, $Fe_3WN$, $Zn_3Nb_3N$, $V_3Zn_2N$ or a combination thereof. The nitride compound may be $Si_6Y_3N_{11}$, $Ni_2Mo_4N$, $Fe_3Mo_5N_6$ or a combination thereof.

20 Claims, 2 Drawing Sheets (51) Int. Cl.
| | |
|---|---|
| *H01M 4/90* | (2006.01) |
| *H01M 8/0215* | (2016.01) |
| *B01J 27/24* | (2006.01) |
| *H01M 8/0206* | (2016.01) |
| *H01M 4/86* | (2006.01) |
| *H01M 4/92* | (2006.01) |
| *H01M 8/1004* | (2016.01) |
| *H01M 8/10* | (2016.01) |

(52) U.S. Cl.
CPC ......... *H01M 4/905* (2013.01); *H01M 4/9041* (2013.01); *H01M 4/9075* (2013.01); *H01M 4/925* (2013.01); *H01M 8/0206* (2013.01); *H01M 8/0215* (2013.01); *H01M 4/9083* (2013.01); *H01M 8/1004* (2013.01); *H01M 2008/1095* (2013.01); *Y02E 60/50* (2013.01); *Y02T 90/40* (2013.01); *Y10T 428/12576* (2015.01); *Y10T 428/265* (2015.01)

(58) Field of Classification Search
CPC ... H01M 8/0206; H01M 4/9083; C23C 16/34; Y10T 428/12576; Y10T 428/265; Y02E 60/50
See application file for complete search history.

(56) References Cited

U.S. PATENT DOCUMENTS

| | | | |
|---|---|---|---|
| 2009/0011310 A1* | 1/2009 | Trabold | H01M 8/04291 429/457 |
| 2010/0200120 A1 | 8/2010 | Horie et al. | |
| 2011/0033784 A1 | 2/2011 | Ljungcrantz et al. | |
| 2011/0059389 A1* | 3/2011 | Claude | H01M 8/026 429/522 |
| 2018/0241059 A1* | 8/2018 | Shin | H01M 8/04197 |

* cited by examiner

FUEL CELL COMPONENTS PROTECTED WITH NITRIDE MATERIALS

TECHNICAL FIELD

The present disclosure relates to fuel cell components protected with nitride materials. The nitride materials may be ternary nitride compounds. The fuel cell component may be a bipolar plate coated with the nitride material. The fuel cell component may also be a catalyst material mixed with the nitride material or a catalyst support including the nitride material.

BACKGROUND

Metals have been a widely used material for thousands of years. Various methods have been developed to preserve metals and prevent their corrosion or disintegration into oxides, hydroxides, sulfates, and other salts. Metals in some industrial applications are especially susceptible to corrosion due to aggressive operating environments. A non-limiting example may be metal components of a fuel cell (e.g. bipolar plates). For instance, bipolar plates are required to be not only sufficiency chemically inert to resist degradation in a highly corrosive environment of the fuel cell, but also electrically conducting to facilitate electron transfer for the oxygen reduction reaction of the fuel cell. Finding a material that meets both the requirements of anti-corrosion and electric conduction has been a challenge.

SUMMARY

According to one embodiment, a fuel cell component including a fuel cell substrate and a nitride material is disclosed. The material may be a nitride compound having a chemical formula $A_xB_yN_z$, where A is a metal, B is a metal different than A, N is nitrogen, x>0, y<7 and 0<z<12. The nitride compound may have a ratio of a stoichiometric factor to a reactivity factor of greater than 1.0. The stoichiometric factor indicates the reactivity of a nitride compound with one or more chemical species as compared to a baseline nitride compound. The reactivity factor indicates the reaction enthalpy of the nitride compound and the one or more chemical species as compared to a baseline nitride compound and the one or more chemical species. The one or more chemical species may be $H_3O$, HF, and/or $SO_3$. The baseline nitride compound may be TiN. If the stoichiometric factor is greater than 1.0, then the nitride compound reacts with more species (e.g. $H_3O$, HF, and/or $SO_3$) than TiN. If the reactivity factor is greater than 1.0, then the reaction enthalpy of the nitride compound and the one or chemical species (e.g. $H_3O$, HF, and/or $SO_3$) is more negative (i.e. decomposes more favorably) than TiN reacting with the one or more chemical species. The nitride compound may be $Fe_3Mo_3N$, $Ni_2Mo_3N$, $Ni_2W_3N$, $CuNi_3N$, $Fe_3WN$, $Zn_3Nb_3N$, $V_3Zn_2N$ or a combination thereof. The nitride compound may be $Si_6Y_3N_{11}$, $Ni_2Mo_4N$, $Fe_3Mo_5N_6$ or a combination thereof.

In another embodiment, a fuel cell bipolar plate is disclosed. The bipolar plate includes a substrate having first and second surfaces. The surface layer coating is applied on at least one of the first and/or second surface. The surface layer coating may be a nitride compound having a chemical formula $A_xB_yN_z$, where A is a metal, B is a metal different than A, N is nitrogen, x>0, y<7 and 0<z<12. The nitride compound may have a ratio of a stoichiometric factor to a reactivity factor of greater than 1.0. The stoichiometric factor indicates the reactivity of a nitride compound with one or more chemical species as compared to a baseline nitride compound. The reactivity factor indicates the relative reaction enthalpy of the nitride compound and the one or more chemical species as compared to a baseline nitride compound and the one or more chemical species. The one or more chemical species may be $H_3O$, HF, and/or $SO_3$. The baseline nitride compound may be TiN. If the stoichiometric factor is greater than 1.0, then the nitride compound reacts with more species (e.g. $H_3O$, HF, and/or $SO_3$) than TiN. If the reactivity factor is greater than 1.0, then the reaction enthalpy of the nitride compound and the one or chemical species (e.g. $H_3O$, HF, and/or $SO_3$) is more negative (i.e. decomposes more favorably) than TiN reacting with the one or more chemical species. The nitride compound may be $Fe_3Mo_3N$, $Ni_2Mo_3N$, $Ni_2W_3N$, $CuNi_3N$, $Fe_3WN$, $Zn_3Nb_3N$, $V_3Zn_2N$ or a combination thereof. The nitride compound may be $Si_6Y_3N_{11}$, $Ni_2Mo_4N$, $Fe_3Mo_5N_6$ or a combination thereof.

In yet another embodiment, a fuel cell catalyst material is disclosed. The material includes a substrate and a nitride material mixed with or coated onto the substrate. The nitride material may be a nitride compound having a chemical formula $A_xB_yN_z$, where A is a metal, B is a metal different than A, N is nitrogen, x>0, y<7 and 0<z<12. The nitride compound may have a ratio of a stoichiometric factor to a reactivity factor of greater than 1.0. The stoichiometric factor indicates the reactivity of a nitride compound with one or more chemical species as compared to a baseline nitride compound. The reactivity factor indicates the relative reaction enthalpy of the nitride compound and the one or more chemical species as compared to a baseline nitride compound and the one or more chemical species. The one or more chemical species may be $H_3O$, HF, and/or $SO_3$. The baseline nitride compound may be TiN. If the stoichiometric factor is greater than 1.0, then the nitride compound reacts with more species (e.g. $H_3O$, HF, and/or $SO_3$) than TiN. If the reactivity factor is greater than 1.0, then the reaction enthalpy of the nitride compound and the one or chemical species (e.g. $H_3O$, HF, and/or $SO_3$) is more negative (i.e. decomposes more favorably) than TiN reacting with the one or more chemical species. The nitride compound may be $Fe_3Mo_3N$, $Ni_2Mo_3N$, $Ni_2W_3N$, $CuNi_3N$, $Fe_3WN$, $Zn_3Nb_3N$, $V_3Zn_2N$ or a combination thereof. The nitride compound may be $Si_6Y_3N_{11}$, $Ni_2Mo_4N$, $Fe_3Mo_5N_6$ or a combination thereof.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Except in the examples, or where otherwise expressly indicated, all numerical quantities in this description indicating amounts of material or conditions of reaction and/or use are to be understood as modified by the word about in describing the broadest scope of the invention. Practice within the numerical limits stated is generally preferred. Also, unless expressly stated to the contrary: percent, "parts of," and ratio values are by weight; the term "polymer" includes "oligomer," "copolymer," "terpolymer," and the like; the description of a group or class of materials as suitable or preferred for given purpose in connection with the invention implies the mixtures of any two or more of the members of the group or class are equally suitable or preferred; molecular weights provided for any polymers refers to number average molecular weight; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

This invention is not limited to the specific embodiments and methods described below, as specific components and/or conditions may vary. Furthermore, the terminology used herein is used only for the purpose of describing particular embodiments of the present invention and is not intended to be limiting in any way.

As used in the specification and the appended claims, the singular form "a," "an," and "the" comprise plural referents unless the context clearly indicates otherwise. For example, reference to a component in the singular is intended to comprise a plurality of components.

The term "substantially," "generally," or "about" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

With respect to the terms "comprising," "consisting of," and "consisting essentially of," where one of these three terms is used herein, the presently disclosed and claimed subject matter can include the use of either of the other two terms.

It should also be appreciated that integer ranges explicitly include all intervening integers. For example, the integer range 1 to 10 explicitly includes 1, 2, 3, 4, 5, 6, 7, 8, 9 and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits.

Corrosion may cause degradation in fuel cell metal components, such as bipolar plates. Corrosion is a process by which refined metal is converted to a more chemically stable form such as a metal oxide, hydroxide, sulfide and/or other salts. The more chemically stable form may be less desirable because it exhibits one or more less desirable properties or inhibits one or more desirable properties. The conversion may present a steady destruction of the metal material. The conversion may include the electrochemical oxidation of the metal with an oxidant such as oxygen or water. Corrosion may occur when a metal component is exposed to moisture in the air, to a solution with a relatively low pH or high pH, and/or various chemical substances such as acids and/or microbes. Elevated temperatures may also accelerate corrosion. What is needed are nitride materials for use in fuel cell metal components, such as bipolar plates, catalyst supports and catalyst materials, that have corrosion resistant characteristics. What is further needed are protective nitride materials capable of imparting anti-corrosive properties onto metal substrate in other chemically aggressive environments.

Titanium nitride (TiN) is presently used as a bipolar plate coating material for commercial-scale fuel cells (e.g. PEMFCs) and stack systems for certain applications, such as automotive and stationary applications. As disclosed herein, first-principles density functional theory (DFT) algorithms, calculations and/or methodologies are used to model the reactivity of nitride compounds against $H_3O$, HF, and $SO_3$ to identify nitride compounds that are comparably more effective than TiN as materials that protect fuel cell metal components from corrosion in the acidic environment of a fuel cell. These comparably superior nitride compounds may also be used as a nitride-based catalyst support for Pt and other nano-sized catalyst particles used in fuel cells. In one or more embodiments, the following nitride compounds are suitable for use to protect metal components of fuel cells and other metal components in other environments susceptible to corrosion: $Fe_3Mo_3N$, $Ni_2Mo_3N$, $Ni_2W_3N$, $CuNi_3N$, $Fe_3WN$, $Zn_3Nb_3N$, $V_3Zn_2N$, $Si_6Y_3N_{11}$, $Ni_2Mo_4N$, $Fe_3Mo_5N_8$, and combination thereof.

Figure 1:
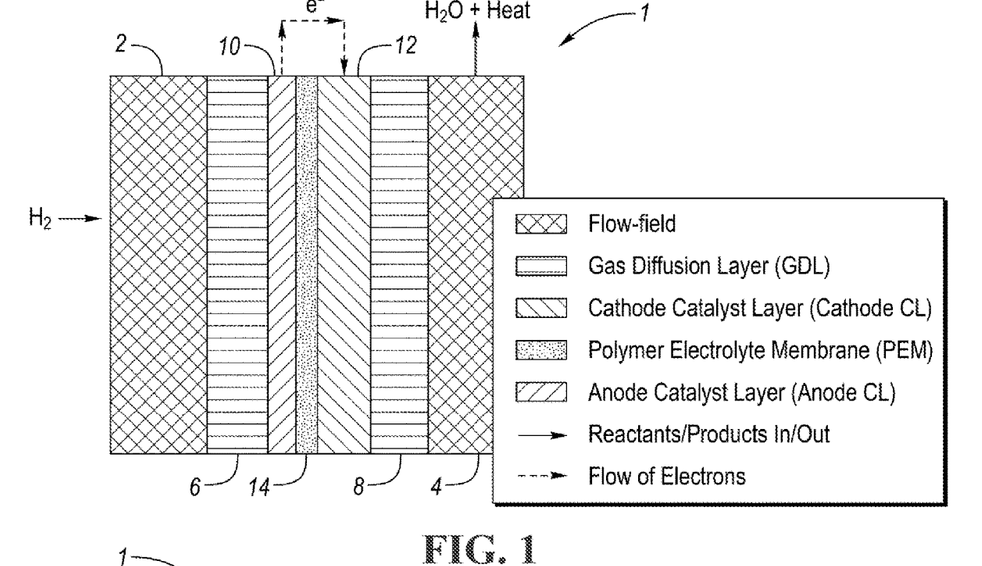
FIG. 1 is a schematic, cross-sectional view of a fuel cell.
Figure 2:
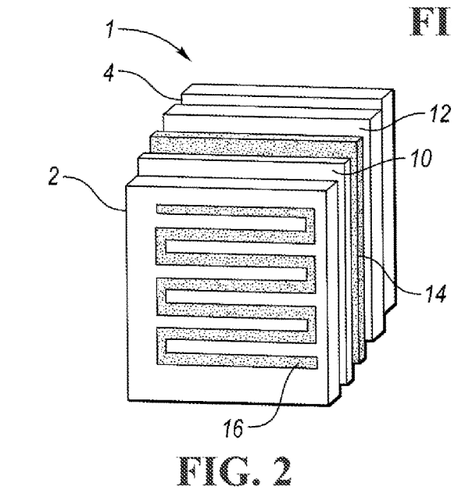
FIG. 2 is a schematic, perspective view of components of the fuel cell shown in FIG. 1.

FIG. 1 is a schematic, cross-sectional view of fuel cell 1. FIG. 2 is a schematic, perspective view of components of fuel cell 1 shown in FIG. 1. FIG. 1 also generally depicts the reactants and products of the operation of fuel cell 1. As shown in FIG. 1, first and second bipolar plates 2 and 4 are positioned at opposite ends of fuel cell 1 and surround first and second gas diffusion layers (GDLs) 6 and 8. The bipolar plates 2 and 4 are typically formed of a metal material. First and second bipolar plates 2 and 4 may include flow-field plates.

Bipolar plates 2 and 4 may provide structural support, conductivity, and may assist in supplying fuel and oxidants (air). Bipolar plates 2 and 4 may also assist in removal of reaction products or byproducts. Bipolar plate 2 includes flow passage 16 and bipolar plate 4 also includes a flow passage (not shown). The flow passages are configured to assist in supplying fuel and/or removing by-products. In one or more embodiments, the depth of a flow passage may be about 0.5 mm. In one or more embodiments, the width of a flow passage may be about 1 mm. In one or more embodiments, a flow passage may be greater than about 1 mm. Bipolar plates 2 and 4 may help regulate or manage thermal conditions in fuel cell 1. Bipolar plates 2 and 4 may contribute significantly to the weight and cost of fuel cell. Bipolar plates 2 and 4 may be made of metal, graphite, composite and/or polymer material. A metal bipolar plate may be made from stainless steel, a titanium-based metallic material or a combination thereof. Bipolar plates 2 and 4 may include a coating. For instance, a coating of the nitride materials as disclosed in one or more embodiments herein.

First and second catalyst layers 10 and 12 are positioned between first and second GDLs 6 and 8 and may be separated by a polymer electrolyte membrane (PEM) 14. As shown in FIG. 1, first catalyst layer 10 is an anode catalyst layer and second catalyst layer 12 is a cathode catalyst layer. Catalyst layers 10 and/or 12 may be supported by a catalyst support material. The catalyst support material may be formed of a metal material. Catalyst layers 10 and 12 include a catalyst material formed of a metal material such as Pt. As shown in FIG. 1, The hydrogen and oxygen reactants are introduced into fuel cell 10 through an opposing flow field and current flows from first catalyst layer 10 (anode catalyst layer) to second catalyst layer 12 (cathode catalyst layer) resulting in the production of $H_2O$ and heat.

In one or more embodiments, fuel cell 1 may be a proton exchange membrane fuel cell (PEMFC). A PEMFC includes a proton exchange membrane, which may also be referred to as a polymer electrolyte membrane (PEM). A membrane electrode assembly (MEA) refers to the membrane, electrodes and may refer to a catalyst or catalyst layer. The catalyst layers may include carbon paper or a carbon support. In one or more embodiments, the MEA may include a gas diffusion layer. PEMFCs commonly operate in acidic environments and may have increased operating temperatures. For example, a PEMFC may operate between about −20 and 100° C.

In one or more embodiments, a PEM may include Nafion XL, Nafion 112, Nafion 115, Nafion 117, and/or Nafion 1110. Nafion membranes may include a fluoropolymer. Electrodes may be made of carbon, carbon cloth and/or carbon fiber. Electrodes may include a catalyst. Catalysts may include but are not limited to Pt, Ru, Ni, Pd, Ir and combinations thereof. As just one non-limiting example, a Pt—Ru catalyst on a carbon support may be used as the electrode catalyst layer. In another embodiment, Pt and another transition metal such as Ni or Co, i.e., Pt—Co or Pt—Ni, may be used as the electrode catalyst layer. In addition, there may be more than three chemical elements that are found in the catalyst composition. One non-limiting example may include Pt—Ni—Mo catalyst.

A core component of a PEMFC is the MEA, which assists the electrochemical reaction within the stack. The MEA includes a PEM through which protons are transferred. As noted above, PEMs commonly comprise polymer-based electrolyte materials such as Nafion. In addition to a PEM, the MEA may also include other subcomponents such as electrodes and catalysts as already described in connection with FIG. 1. Within the MEA, protons are transferred from an anode to a cathode through a PEM and its associated polymer electrolyte. The electrodes may be made of any suitable material and may be heat pressed onto the PEM within the MEA. The anode and cathode electrodes also commonly contain a catalyst layer comprising Pt or another Pt-group metal such as ruthenium. In addition to the MEA and its various subcomponents, a PEMFC also typically includes other components such as current collectors, GDLs, gaskets, and at least one bipolar plate (BPP).

Figure 3:
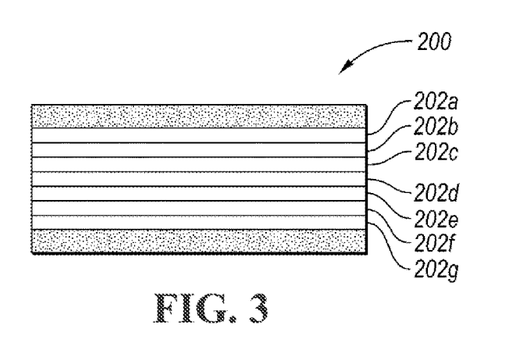
FIG. 3 is a schematic, side view of a fuel cell stack including a plurality of the individual fuel cells as shown in FIGS. 1 and 2.
Figure 4:
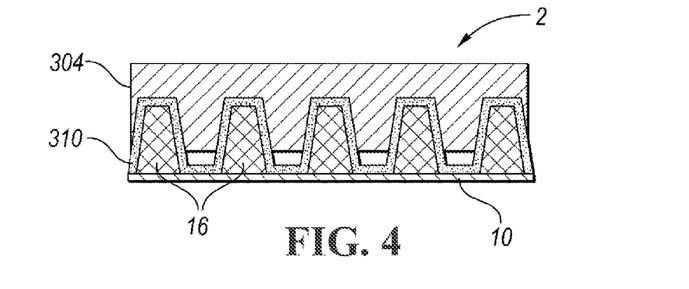
FIG. 4 is a schematic, cross section view of a bipolar plate of the fuel cell shown in FIGS. 1 and 2.

Bipolar plates 2 and 4 may connect and divide individual fuel cells to form a fuel cell stack. Fuel cells may be stacked to increase voltage and/or power. FIG. 3 is a schematic, side view of fuel cell stack 200 including a plurality of the individual fuel cells shown in FIGS. 1 and 2. Fuel cell stack 200 includes a plurality of fuel cells 202a through 202g. FIG. 4 is a schematic, cross-section view of bipolar plate 2 of fuel cell 1. Bipolar plate 2 includes substrate 304 and surface layer coating 310.

Now having described components of fuel cells in which the nitride compounds of one or more embodiments may be applied, below is a description of the DFT algorithms, calculations and/or methodologies used to model the reactivity of nitride compounds against $H_3O$, HF, and $SO_3$. $H_3O$, HF, and $SO_3$ to identify specific nitride compounds suitable for these uses. These caustic species (i.e. $H_3O$, HF, and $SO_3$) are examples of chemical species existing in the PEMFC environment that can cause degradation and corrosion. Such computer-based analysis is used to determine the nitride compounds of one or more embodiments.

The nitride compounds may be ternary nitride compounds. The ternary nitride compounds may have the formula $A_xB_yN_z$, where $0<x$, $y<7$ and $0<z<12$. The results of this data driven experimentation demonstrates that certain ternary nitride compounds are suitable for use in a fuel cell environment (e.g. as a coating for a bipolar plate or a catalyst support layer). In one embodiment, certain reactive, toxic, rare and/or expensive elements are not considered in the data-driven analysis. For example, Pt and Co may not be examined as a protective coating or mixture because of their relatively high costs. In another example, Li and Na may dissolve in an acidic environment, therefore not providing any corrosion protection. In one embodiment, the elements A and B considered include Mg, Al, Si, Ti, V, Cr, Mn, Fe, Ni, Cu, Zn, Y, Zr, Nb, Mo, Sn, and/or W.

Figure 5:
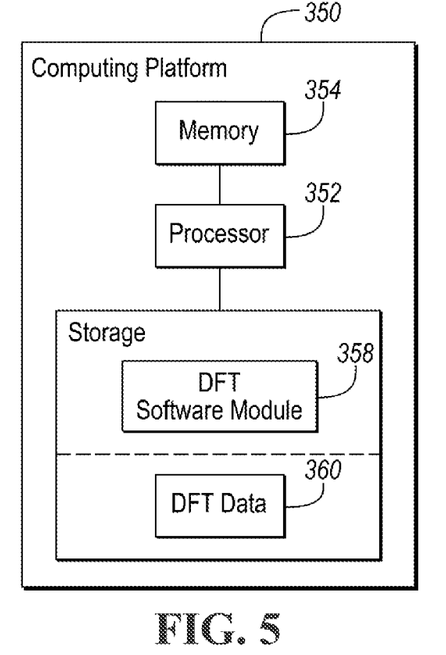
FIG. 5 is a schematic diagram of a computing platform that may utilized to implement first-principles density functional (DFT) theory algorithms, calculations and/or methodologies of one or more embodiments.

The DFT algorithms, calculations and/or methodologies of one or more embodiments are implemented using a computer platform, such as the computing platform 350 illustrated in FIG. 5. The computing platform 350 may include a processor 352, memory 354, and non-volatile storage 356. The processor 352 may include one or more devices selected from high-performance computing (HPC) systems including high-performance cores, microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on computer-executable instructions residing in memory 354. The memory 354 may include a single memory device or a number of memory devices including, but not limited to, random access memory (RAM), volatile memory, non-volatile memory, static random access memory (SRAM), dynamic random access memory (DRAM), flash memory, cache memory, or any other device capable of storing information. The non-volatile storage 356 may include one or more persistent data storage devices such as a hard drive, optical drive, tape drive, non-volatile solid-state device, cloud storage or any other device capable of persistently storing information.

Processor 352 may be configured to read into memory 354 and execute computer-executable instructions residing in DFT software module 358 of the non-volatile storage 356 and embodying DFT slab model algorithms, calculations and/or methodologies of one or more embodiments. DFT software module 358 may include operating systems and applications. DFT software module 358 may be compiled or interpreted from computer programs created using a variety of programming languages and/or technologies, including, without limitation, and either alone or in combination, Java, C, C++, C#, Objective C, Fortran, Pascal, Java Script, Python, Perl, and PL/SQL.

Upon execution by the processor 352, the computer-executable instructions of the DFT software module 358 may cause the computing platform 350 to implement one or more of the DFT algorithms and/or methodologies disclosed herein. Non-volatile storage 356 may also include DFT data 360 supporting the functions, features, calculations, and processes of the one or more embodiments described herein.

The program code embodying the algorithms and/or methodologies described herein is capable of being individually or collectively distributed as a program product in a variety of different forms. The program code may be distributed using a computer readable storage medium having computer readable program instructions thereon for causing a processor to carry out aspects of one or more embodiments. Computer readable storage media, which is inherently non-transitory, may include volatile and non-volatile, and removable and non-removable tangible media implemented in any method or technology for storage of information, such as computer-readable instructions, data structures, program modules, or other data. Computer readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. Computer readable program instructions may be downloaded to a computer, another type of programmable data processing apparatus, or another device from a computer readable storage medium or to an external computer or external storage device via a network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions, acts, and/or operations specified in the flowcharts or diagrams. In certain alternative embodiments, the functions, acts, and/or operations specified in the flowcharts and diagrams may be re-ordered, processed serially, and/or processed concurrently consistent with one or more embodiments. Moreover, any of the flowcharts and/or diagrams may include more or fewer nodes or blocks than those illustrated consistent with one or more embodiments.

In one embodiment, the DFT algorithms, calculations and/or methodologies utilize the interface reactions module kit, available from materialsproject.org. The materialsproject.org database includes data regarding ternary nitride compounds predicted by Sun et al. in Nature Materials, 2019, 18, 732. The materialsproject.org database also includes the crystal structures and energies of the ternary nitrides.

Figure 6:
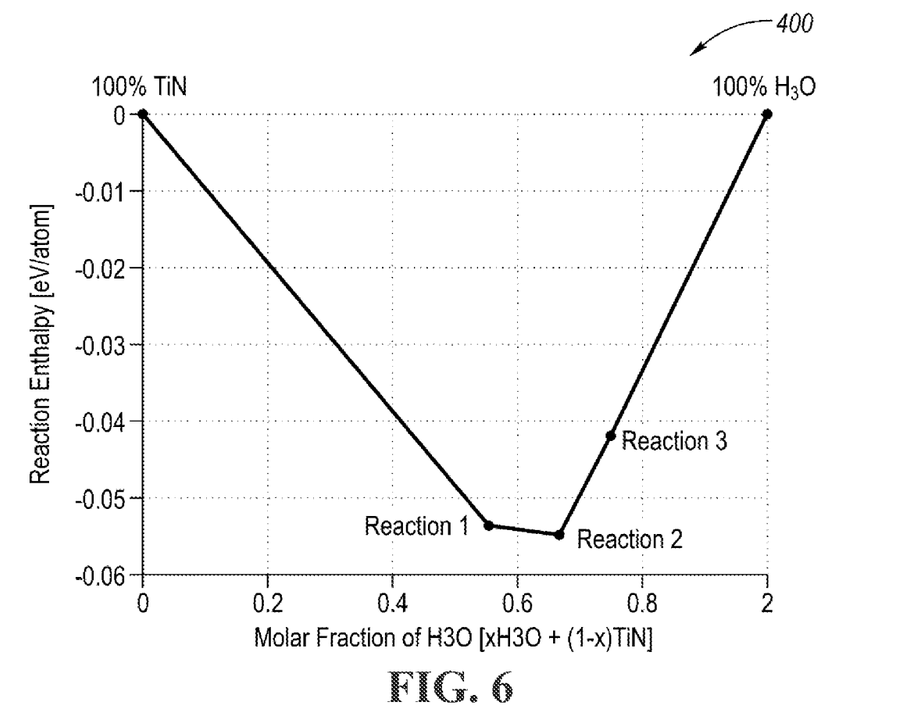
FIG. 6 depicts a graph showing an example of a phase diagram between $H_3O$ and TiN reactions.

The DFT algorithms, calculations and/or methodologies may examine a stable decomposition reaction of $A_xB_yN_z$ having a tie line with $H_3O$, HF and/or $SO_3$ for a given chemical space. FIG. 6 depicts graph 400 showing an example of a phase diagram between $H_3O$ and TiN reactions. The molar fraction (x) indicates the amount of $H_3O$ and TiN as the reactant. For example, when x=0, the reactant is pure TiN, and when x=1, the reactant is 100% $H_3O$.

As shown in FIG. 6, Reaction 1 (i.e., the first decomposition reaction) takes place at x=0.556, where $0.556H_3O$ and $0.444TiN$ react to form $0.444H_3N$, $0.167TiH_2$, and $0.278TiO_2$. In FIG. 6, the reaction enthalpy for Reaction 1 ($\Delta E_{Rxn}$) is $-0.054$ eV/atom. If Reaction 1 takes place at a value larger than x=0.556 for any $A_xB_yN_z$, then more $H_3O$ molecules are needed to decompose $A_xB_yN_z$ (i.e., more protective than TiN per mole of $A_xB_yN_z$). The magnitude of reaction enthalpy in the y-axis is also a consideration. For example, if the reaction enthalpy for Reaction 1 is predicted to be a larger value (i.e., more positive) than y=$-0.054$ eV/atom for any $A_xB_yN_z$, the decomposition reaction happens less favorably, which is a positive result.

In one or more embodiments, both the x and y values for Reaction 1 are maximized to find ternary nitride compounds that are more protective than TiN compounds for coating bipolar plates. In another embodiment, a significant increase in either the molar fraction or reaction enthalpy may be enough to surpass the baseline corrosion protection as compared to TiN. In other words, the molar fraction (x) may be less (e.g. less $H_3O$ needed to decompose $A_xB_yN_z$), but if the reaction enthalpy is significantly more positive, it could be still better than TiN (vice versa). Table 1 shows the chemical reactivity between TiN and $H_3O$, HF, and $SO_3$. As shown in Table 1, x values for TiN are 0.556, 0.8 and 0.353 for $H_3O$, HF and $SO_3$, respectively. The reaction enthalpy ($\Delta E_{Rxn}$) is also provided for each species, which is the y-value on a graph for the given decomposition reaction.

TABLE 1

| Species i | Species | Decomposition Reaction against $H_3O$, HF, and $SO_3$ | $\Delta E_{Rxn}$ |
|---|---|---|---|
| TiN | $H_3O$ | $0.556H_3O + 0.444TiN \rightarrow 0.444H_3N + 0.167TiH_2 + 0.278TiO_2$ | $-0.054$ |
|  | HF | $0.8HF + 0.2TiN \rightarrow 0.2H_4NF + 0.2TiF_3$ | $-0.376$ |
|  | $SO_3$ | $0.353SO_3 + 0.647TiN \rightarrow 0.118TiS_3 + 0.529TiO_2 + 0.324N_2$ | $-0.489$ |

Table 2 shows ternary nitride compounds more protective than TiN according to the data driven analysis of one or more embodiments. A first group of ternary nitride materials more protective than TiN include $Fe_3Mo_3N$, $Ni_2Mo_3N$, $Ni_2W_3N$, $CuNi_3N$, $Fe_3WN$, $Zn_3Nb_3N$, and $V_3Zn_2N$. These ternary nitride compounds are found in the Inorganic Crystal Structure Database (ICSD). A second group of ternary materials more protective than TiN may include $Si_6Y_3N_{11}$, $Ni_2Mo_4N$, and $Fe_3Mo_5N_6$. These ternary nitride compounds are found in Sun et al. in Nature Materials, 2019, 18, 732. These compounds are considered "stable" (e.g. high likelihood that they can be synthesized thermodynamically) or "nearly-stable" (e.g. the compounds can be experimentally synthesized, but may further decompose to more "stable" phase mixtures. The ternary nitride compounds used in one or more embodiments may be $Fe_3Mo_3N$, $Ni_2Mo_3N$, $Ni_2W_3N$, $CuNi_3N$, $Fe_3WN$, $Zn_3Nb_3N$, $V_3Zn_2N$, $Si_6Y_3N_{11}$, $Ni_2Mo_4N$, $Fe_3Mo_5N_6$ and combinations thereof.

TABLE 2

| Species i | Species | Decomposition Reaction against $H_3O$, HF, and $SO_3$ | $\Delta E_{Rxn}$ |
|---|---|---|---|
| $Fe_3Mo_3N$ | $H_3O$ | $0.75H_3O + 0.25Fe_3Mo_3N \rightarrow 0.25H_5NO + 0.75Fe + 0.75Mo + 0.5\,H_2O$ | −0.046 |
| | HF | $0.8HF + 0.2Fe_3Mo_3N \rightarrow 0.3FeF_2 + 0.2H_4NF + 0.3Fe + 0.6Mo$ | −0.255 |
| | $SO_3$ | $0.5SO_3 + 0.5Fe_3Mo_3N \rightarrow 1.5FeO + 0.5MoN + 0.25MoS_2 + 0.75Mo$ | −0.434 |
| $Ni_2Mo_3N$ | $H_3O$ | $0.75H_3O + 0.25Ni_2Mo_3N \rightarrow 0.25H_5NO + 0.167Ni_3Mo + 0.583Mo + 0.5\,H_2O$ | −0.031 |
| | HF | $0.8HF + 0.2Ni_2Mo_3N \rightarrow 0.133Ni_3Mo + 0.2H_4NF + 0.2MoF_3 + 0.267Mo$ | −0.188 |
| | $SO_3$ | $0.429SO_3 + 0.571Ni_2Mo_3N \rightarrow 0.286Ni_4Mo + 0.571MoN + 0.214MoS_2 + 0.643MoO_2$ | −0.314 |
| $Ni_2W_3N$ | $H_3O$ | $0.75H_3O + 0.25Ni_2W_3N \rightarrow 0.25H_5NO + 0.5H_2O + 0.125Ni_4W + 0.625W$ | −0.052 |
| | HF | $0.833HF + 0.167Ni_2W_3N \rightarrow 0.167H_5NF_2 + 0.083WF_6 + 0.083Ni_4W + 0.333W$ | −0.116 |
| | $SO_3$ | $0.478SO_3 + 0.522Ni_2W_3N \rightarrow 0.717WO_2 + 0.261Ni_4W + 0.174W_2N_3 + 0.239WS_2$ | −0.361 |
| $CuNi_3N$ | $H_3O$ | $0.25CuNi_3N + 0.75H_3O \rightarrow 0.25H_5NO + 0.25Cu + 0.75Ni + 0.5H_2O$ | −0.104 |
| | HF | $0.2CuNi_3N + 0.8HF \rightarrow 0.2H_4NF + 0.3NiF_2 + 0.2Cu + 0.3Ni$ | −0.151 |
| | $SO_3$ | $0.727SO_3 + 0.273CuNi_3N \rightarrow 0.091Ni_3S_2 + 0.545NiSO_4 + 0.136N_2 + 0.273Cu$ | −0.171 |
| $Fe_3WN$ | $H_3O$ | $0.75H_3O + 0.25Fe_3WN \rightarrow 0.25H_5NO + 0.5H_2O + 0.042Fe_7W_6 + 0.458Fe$ | −0.066 |
| | HF | $0.8HF + 0.2Fe_3WN \rightarrow 0.3FeF_2 + 0.2H_4NF + 0.033Fe_7W_6 + 0.067Fe$ | −0.312 |
| | $SO_3$ | $0.4SO_3 + 0.6Fe_3WN \rightarrow 1.2FeO + 0.2WS_2 + 0.2W_2N_3 + 0.6\,Fe$ | −0.426 |
| $Zn_3Nb_3N$ | $H_3O$ | $0.513H_3O + 0.487Nb_3Zn_3N \rightarrow 0.487NbN + 0.769NbH_2 + 0.103Nb_2O_5 + 1.462Zn$ | −0.030 |
| | HF | $0.83HF + 0.17Nb_3Zn_3N \rightarrow 0.132Nb_2F_5 + 0.17NbZn_3 + 0.17H_4NF + 0.075NbH_2$ | −0.194 |
| | $SO_3$ | $0.625SO_3 + 0.375Nb_3Zn_3N \rightarrow 0.625ZnS + 0.375NbN + 0.375Nb_2O_5 + 0.5Zn$ | −0.904 |
| $V_3Zn_2N$ | $H_3O$ | $0.48H_3O + 0.52V_3Zn_2N \rightarrow 0.52VN + 0.72VH_2 + 0.16V_2O_3 + 1.04Zn$ | −0.037 |
| | HF | $0.667HF + 0.333V_3Zn_2N \rightarrow 0.333VF_2 + 0.333VH_2 + 0.333VN + 0.667Zn$ | −0.184 |
| | $SO_3$ | $0.5SO_3 + 0.5V_3Zn_2N \rightarrow 0.5ZnS + 0.5VN + 0.5V_2O_3 + 0.5Zn$ | −0.694 |
| $Si_6Y_3N_{11}$ | $H_3O$ | $0.783H_3O + 0.217Y_3Si_6N_{11} \rightarrow 0.13YH_3 + 0.652H_3N + 0.435Si_3N_4 + 0.261Y_2O_3$ | −0.145 |
| | HF | $0.9HF + 0.1Y_3Si_6N_{11} \rightarrow 0.3H_3N + 0.2Si_3N_4 + 0.3YF_3$ | −0.413 |
| | $SO_3$ | $0.529SO_3 + 0.471Y_3Si_6N_{11} \rightarrow 0.529Y_2SO_2 + 0.941Si_3N_4 + 0.176Y_2O_3 + 0.706N_2$ | −0.314 |
| $Ni_2Mo_4N$ | $H_3O$ | $0.75H_3O + 0.25Ni_2Mo_4N \rightarrow 0.25H_5NO + 0.167Ni_3Mo + 0.833Mo + 0.5H_2O$ | −0.042 |
| | HF | $0.8HF + 0.2Ni_2Mo_4N \rightarrow 0.133Ni_3Mo + 0.2H_4NF + 0.2MoF_3 + 0.467Mo$ | −0.191 |
| | $SO_3$ | $0.333SO_3 + 0.667Ni_2Mo_4N \rightarrow 0.667Ni_2Mo_3N + 0.167MoS_2 + 0.5MoO_2$ | −0.279 |
| $Fe_3Mo_5N_8$ | $H_3O$ | $0.75H_3O + 0.25Fe_3Mo_5N_8 \rightarrow 0.75H_3N + 0.75FeO + 1.25MoN$ | −0.097 |
| | HF | $0.727HF + 0.273Fe_3Mo_5N_8 \rightarrow 0.545FeN + 0.091Mo_{15}N_{16} + 0.273FeF_2 + 0.182H_4NF$ | −0.164 |
| | $SO_3$ | $0.086SO_3 + 0.914Fe_3Mo_5N_8 \rightarrow 0.259FeO + 0.302Mo_{15}N_{16} + 2.483FeN + 0.043MoS_2$ | −0.057 |

The molar fraction x and the reaction enthalpy y are used to compare protection against $H_3O$, HF, and/or $SO_3$ for the considered ternary $A_xB_yN_z$ compounds and TiN. As shown in Table 2, both x and y values are more positive than TiN in certain cases, and there are other cases where either x or y is more positive when compared to TiN.

In one or more embodiments, a stoichiometric factor ($S_{i/TiN,j}$) and a reactivity factor ($R_{i/TiN,j}$) (where i is $A_xB_yN_z$ and j is either $H_3O$, HF, and/or $SO_3$) are examined to determine the ternary nitride compounds for use as protective compounds. The mole fraction x and reaction enthalpy y as shown in FIG. 6 for each ternary nitride compound is compared with TiN. If the stoichiometric factor is greater than 1.0, then the ternary nitride compound reacts with more species j ($H_3O$, HF, and/or $SO_3$) than TiN. If the reactivity factor is greater than 1.0, then the reaction enthalpy of the ternary nitride compound and species j ($H_3O$, HF, and/or $SO_3$) is more negative (i.e. decomposes more favorably) than TiN and the species j. The factor S/R for a given species i and j can be used to evaluate and select protective nitride compounds based on both molar fraction and reaction enthalpy. As shown in Table 3, all top tier compounds show S/R factors greater than 1.0 for all three decomposition species (against $H_3O$, HF, and/or $SO_3$).

TABLE 3

| Compound i | $S_{i/TiN, H_3O}$ | $R_{i/TiN, H_3O}$ | $S/R_{i, H_3O}$ | $S_{i/TiN, HF}$ | $R_{i/TiN, HF}$ | $S/R_{i, HF}$ | $S_{i/TiN, SO_3}$ | $R_{i/TiN, SO_3}$ | $S/R_{i, SO_3}$ |
|---|---|---|---|---|---|---|---|---|---|
| $Fe_3Mo_3N$ | 2.4 | 0.9 | 2.8 | 1.0 | 0.7 | 1.5 | 1.8 | 0.9 | 2.1 |
| $Ni_2Mo_3N$ | 2.4 | 0.6 | 4.2 | 1.0 | 0.5 | 2.0 | 1.4 | 0.6 | 2.1 |
| $Ni_2W_3N$ | 2.4 | 1.0 | 2.5 | 1.2 | 0.3 | 4.0 | 1.7 | 0.7 | 2.3 |
| $CuNi_3N$ | 2.4 | 1.9 | 1.2 | 1.0 | 0.4 | 2.5 | 4.9 | 0.3 | 14.0 |
| $Fe_3WN$ | 2.4 | 1.2 | 2.0 | 1.0 | 0.8 | 1.2 | 1.2 | 0.9 | 1.4 |
| $Zn_3Nb_3N$ | 0.8 | 0.6 | 1.5 | 1.2 | 0.5 | 2.4 | 3.1 | 1.8 | 1.7 |
| $V_3Zn_2N$ | 0.7 | 0.7 | 1.1 | 0.5 | 0.5 | 1.0 | 1.8 | 1.4 | 1.3 |
| $Si_6Y_3N_{11}$ | 2.9 | 2.7 | 1.1 | 2.3 | 1.1 | 2.0 | 2.1 | 0.6 | 3.2 |
| $Ni_2Mo_4N$ | 2.4 | 0.8 | 3.1 | 1.0 | 0.5 | 2.0 | 0.9 | 0.6 | 1.6 |
| $Fe_3Mo_5N_8$ | 2.4 | 1.8 | 1.3 | 0.7 | 0.4 | 1.5 | 0.2 | 0.1 | 1.5 |

The protective nitride compounds may be synthesized using different processes. In one process, a solid-state precursor of $A_xB_yO_z$ may be treated with $N_2$, $NH_3$, or both at 250 to 2,000° C. to yield a ternary nitride compound, $A_xB_yN_z$. In another process, two different metallic complexes may be dissolved in a common solvent to form a dissolved solution. The two different metallic complexes may be different metal chlorides. The common solvent may be water, acetonitrile, acetone, ethanol, iso-propyl alcohol, and combination thereof. A chemical molecule may be added to the dissolved solution to form a precipitate. The precipitate can be filtered and dried and further heated in a gas to form a ternary nitride compound. The gas may be $N_2$, $NH_3$ or combination thereof. A sol-gel process may also be used to synthesize a ternary nitride compound. The sol-gel process may utilize one or more metal alkoxides.

The protective nitride compound may be applied to a bipolar plate or other metal substrate using a deposition technique. Electrospun precursor fibers containing target metals (i.e. metals that make up a ternary nitride compound) may be thermally treated. An organic molecule may be added to the electrospun precursor fibers to help control the morphology of the resulting fibers. In another process, a viscous precursor solution including target metals may be dried into a glass or glassy film. A processing step can be used to deposit the precursor solution onto a substrate. The processing step may be spray coating, spinning, printing or templating. Physical deposition, chemical deposition, atomic layer deposition, plasma, and laser methods may be used to deposit a protective nitride material onto a metal substrate.

The protective nitride compound may be used in a fuel cell catalyst material. For example, the nitride compound may be mixed with a catalyst-containing precursor in a solution. The catalyst-containing precursor may be an H—Pt—Cl complex. The solution may be heat treated to form a catalyst/nitride compound catalyst material, such as a $Pt/A_xB_yN_z$ catalyst material. In one or more embodiments, the catalyst material may contain transition metal compounds other than those in the nitride compound and/or noble metals other than Pt. The other transition metal compounds may include without limitation Co, Ni, Fe and/or Ti. The other noble metals may include Ru, Pd, Ag and/or Au.

The ternary nitride compounds of one or more embodiments may be mixed with TiN or one or more conductive, anti-corrosive oxides (e.g. $MgTi_2O_{5-x}$ and $TiO_x$) to form a protective coating mixture. The protective coating mixture may be applied as a protective coating of a bipolar plate. The thickness of the protective coating may be in the range of 1 nanometer to 10 microns.

One or more of the ternary nitride compounds of one or more embodiments may be applied as a plurality of layers, for example, by using repeated an atomic layer deposition technique, or other well-controlled deposition technique. Each layer may have an independently selected thickness on a nanoscale (e.g. 1 to 20 nanometers) or a microscale (e.g. 1 to 5 microns). The plurality of layers may be in the range of 2 to 20 layers. Each layer may be formed of the same ternary nitride compound. In another embodiment, the plurality of layers may include two or more different types of ternary nitride compounds. In one embodiment, the plurality of layers is formed of alternating layers of first and second types of ternary nitride compounds. The ternary nitride compounds of one or more embodiments may be formed on a metal surface (e.g. a surface of a bipolar plate) in-situ by a nitriding process. For instance, Fe—Mo—N, Ni—Mo—N compounds can be formed by a nitriding process on the surface of stainless steel.

The ternary nitride compounds of one or more embodiments may be used in a catalyst support configured to support a fuel cell catalyst. The fuel cell catalyst may be a Pt catalyst, a Pt-alloy catalyst and/or a combination thereof. The ternary nitride compounds of one or more embodiments may be mixed with a catalyst support material to form a mixed catalyst support. The catalyst support material may be an oxide catalyst support material (e.g. MgO, $Al_2O_3$, $TiO_2$, $ZrO_2$, $SnO_2$ and combinations thereof), a carbon catalyst support material and/or a combination thereof. One or more of the ternary nitride compounds of one or more embodiments may be formed as localized surface regions of a fuel cell catalyst support. The localized regions including the one or more of the ternary nitride compounds may serve as catalytic active sites to enhance the performance of the catalyst material loaded onto the catalyst support.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A fuel cell, configured to operate in a fuel cell environment including one or more corrosive species, the fuel cell comprising:
   a bipolar plate having first and second surfaces and a surface layer coating on at least one of the first and/or second surfaces, the surface layer coating including a nitride material, the nitride material is a nitride compound selected from the group consisting of $Fe_3Mo_3N$, $Ni_2Mo_3N$, $Ni_2W_3N$, $CuNi_3N$, $Fe_3WN$, $Zn_3Nb_3N$, $V_3Zn_2N$, and a combination thereof, the nitride compound has a ratio of a stoichiometric factor to a reactivity factor of greater than 1.0 to protect the bipolar plate from the one or more corrosive species in the fuel cell environment.

2. The fuel cell of claim 1, wherein the nitride compound is amorphous or crystalline.

3. A fuel cell, configured to operate in a fuel cell environment including one or more corrosive species, the fuel cell comprising:
   a bipolar plate having first and second surfaces and a surface layer coating on at least one of the first and/or second surfaces, the surface layer coating including a nitride material, the nitride material is a nitride compound selected from the group consisting of $Si_6Y_3N_{11}$, $Ni_2Mo_4N$, $Fe_3Mo_5N_6$, and a combination thereof, the nitride compound has a ratio of a stoichiometric factor to a reactivity factor of greater than 1.0 to protect the bipolar plate from the one or more corrosive species in the fuel cell environment.

4. The fuel cell of claim 3, wherein the bipolar plate is formed from stainless steel, a titanium-based metallic compounds or a combination thereof.

5. The fuel cell of claim 3, wherein the surface layer coating further includes TiN, one or more conductive, anti-corrosive oxides and/or combinations thereof.

6. The fuel cell of claim 3, wherein the surface layer coating is comprised of a plurality of layers.

7. The fuel cell of claim 6, wherein each of the plurality of layers has a thickness of 1 to 20 nanometers.

8. A fuel cell configured to operate in a fuel cell environment, the fuel cell comprising:
   a bipolar plate;
   a gas diffusion layer; and
   a catalyst layer spaced apart from the bipolar plate by the gas diffusion layer, the catalyst layer having a catalyst material and a catalyst support, the catalyst material is mixed with and/or the catalyst support is coated with a nitride material, the nitride material is a nitride compound having a chemical formula $A_xB_yNz$, where A is a first metal, B is a second metal different than A, N is nitrogen, x>0, y<7 and 0<z<12, the nitride compound has a ratio of a stoichiometric factor to a reactivity factor of greater than 1.0.

9. The fuel cell of claim 8, wherein the catalyst support includes an oxide material and/or a carbon material.

10. The fuel cell of claim 9, wherein the catalyst support includes an oxide material, and the oxide material is MgO, $Al_2O_3$, $TiO_2$, $ZrO_2$, $SnO_2$ or a combination thereof.

11. The fuel cell of claim 8, wherein the catalyst support includes localized surface regions including the nitride material.

12. The fuel cell of claim 8, wherein the catalyst material is Pt, Co, Ni, Fe, Ti, Ru, Pd, Ag, Au or a combination thereof.

13. The fuel cell of claim 8, wherein the nitride compound is $Fe_3Mo_3N$, $Ni_2Mo_3N$, $Ni_2W_3N$, $CuNi_3N$, $Fe_3WN$, $Zn_3Nb_3N$, $V_3Zn_2N$ or a combination thereof.

14. The fuel cell of claim 8, the nitride compound is $Si_6Y_3Ne_{11}$, $Ni_2Mo_4N$, $Fe_3Mo_5N_6$ or a combination thereof.

15. The fuel cell of claim 1, wherein the one or more corrosive species are $H_3O$, HF, and/or $SO_3$.

16. The fuel cell of claim 1, wherein the stoichiometric and reactivity factors are relative to TiN.

17. The fuel cell of claim 3, wherein the one or more corrosive species are $H_3O$, HF, and/or $SO_3$.

18. The fuel cell of claim 3, wherein the stoichiometric and reactivity factors are relative to TiN.

19. The fuel cell of claim 8, wherein the one or more corrosive species are $H_3O$, HF, and/or $SO_3$.

20. The fuel cell of claim 8, wherein the stoichiometric and reactivity factors are relative to TiN.

* * * * *